United States Patent
Hanson et al.

(10) Patent No.: US 10,910,820 B2
(45) Date of Patent: Feb. 2, 2021

(54) FAST OVER VOLTAGE AND SURGE DETECTION FOR HIGH SPEED AND LOAD SWITCHES

(71) Applicant: NXP B.V., Eindhoven (NL)

(72) Inventors: Harold Garth Hanson, Queen Creek, AZ (US); Siamak Delshadpour, Phoenix, AZ (US)

(73) Assignee: NXP B.V., Eindhoven (NL)

( * ) Notice: Subject to any disclaimer, the term of this patent is extended or adjusted under 35 U.S.C. 154(b) by 270 days.

(21) Appl. No.: 16/049,323

(22) Filed: Jul. 30, 2018

(65) Prior Publication Data

US 2020/0036182 A1 Jan. 30, 2020

(51) Int. Cl.
*H02H 3/20* (2006.01)
*H02H 3/22* (2006.01)

(52) U.S. Cl.
CPC ............... *H02H 3/20* (2013.01); *H02H 3/22* (2013.01)

(58) Field of Classification Search
CPC .... H02H 3/22; H02H 3/20; H03K 2217/0072; H03K 2217/0063; H03K 2217/0054; H03K 2217/0036; H03K 17/082; H03K 17/0822; H03K 17/687
See application file for complete search history.

(56) References Cited

U.S. PATENT DOCUMENTS

| 8,159,797 B2 * | 4/2012 | Tamegai ............... H02J 7/0031 361/18 |
|---|---|---|
| 2005/0212489 A1 | 9/2005 | Denning et al. |
| 2008/0186644 A1 | 8/2008 | Migliavacca |
| 2009/0237850 A1 | 9/2009 | Wu et al. |
| 2010/0156470 A1 | 6/2010 | Maltione et al. |
| 2010/0284116 A1 | 11/2010 | Yoshizawa |
| 2018/0026440 A1 | 1/2018 | Zhao et al. |
| 2018/0138696 A1 | 5/2018 | Tang et al. |

* cited by examiner

*Primary Examiner* — Kyle J Moody

(57) ABSTRACT

A protection circuit including a pad configured to input an external voltage from a connector, a first circuit branch connected to the pad and configured to receive a fast ramp-up surge at the pad, a second circuit branch connected to the pad and configured to receive a ramp-up surge at the pad, a third circuit branch connected to the pad and configured to output a surge detection signal when a surge voltage is received at the pad, an enabling transistor connected between the second circuit branch and the third circuit branch, at least one switch to be protected, and a controller configured to control components of the second circuit branch and third circuit branch of the protection circuit based on an on-state of the at least one switch to be protected.

18 Claims, 5 Drawing Sheets

FAST OVER VOLTAGE AND SURGE DETECTION FOR HIGH SPEED AND LOAD SWITCHES

TECHNICAL FIELD

Embodiments disclosed herein relate generally to over voltage protection, more particularly to the protection of high speed or load switches in an over voltage or surge condition.

SUMMARY

A brief summary of various embodiments is presented below. Some simplifications and omissions may be made in the following summary, which is intended to highlight and introduce some aspects of the various embodiments, but not to limit the scope of the invention. Detailed descriptions of embodiments adequate to allow those of ordinary skill in the art to make and use the inventive concepts will follow in later sections.

Embodiments include a protection circuit including a pad configured to input an external voltage from a connector, a first circuit branch connected to the pad and configured to receive a fast ramp-up surge at the pad, a second circuit branch connected to the pad and configured to receive a ramp-up surge at the pad, a third circuit branch connected to the pad and configured to output a surge detection signal when a surge voltage is received at the pad, an enabling transistor connected between the second circuit branch and the third circuit branch, at least one switch to be protected; and a controller configured to control components of the second circuit branch and third circuit branch of the protection circuit based on an on-state of the at least one switch to be protected.

The third branch may include a comparator to output the surge detection signal when the surge voltage is received at the pad. The enabling transistor may enable the comparator when the surge voltage is received at the pad. The protection circuit may stay off in a first state to avoid current consumption of the comparator.

The first branch may include a pair of series connected capacitors.

The third branch may include an extended drain transistor to protect internal circuitry of the protection circuit during a surge event.

The protection circuit may include a plurality of series connected transistors to contribute to a threshold voltage of the first branch. The series-connected transistors are diode-connected transistors.

The the comparator may output an over-voltage signal to the controller to shut down the at least one switch when the at least one switch is in an on-mode.

The controller may receive the surge detection signal and switches off the at least one switch to protect the at least one switch from a surge received at the pad.

If the switch to be protected is off, the controller may not supply power to transistors of the second branch and the third branch.

When the switch to be protected is on and the pad voltage is below the surge level, a DC current of detection circuit may stay zero.

Embodiments may also include a protection circuit having a pad, including a first branch connected to the pad to determine a threshold voltage of the surge protection circuit, a second branch including an extended drain transistor to protect a source of the extended drain transistor, an enabling transistor connected between the first branch and the second branch, and a comparator enabled by the enabling transistor, the comparator outputting an over-voltage signal when a pad voltage is higher than the threshold voltage.

Embodiments may also include a circuit including a connector, a pad connected to the connector, a protection circuit coupled to the pad, at least one device to be protected by the protection circuit, and a controller connected to the protection circuit a high and the device to be protected, wherein the controller is configured to control an operation of the protection circuit such that the protection circuit does not draw current when the protection circuit is not enabled.

The protection circuit may include a comparator to output a surge detection signal to the controller when a surge event occurs at the pad. The protection circuit may include an enabling transistor that is turned on by a surge event on the pad, and wherein the enabling transistor enables the comparator during the surge event.

The protection circuit may include an extended drain transistor to protect internal circuitry of the protection circuit when a surge event occurs at the pad.

The protection circuit may be configured to receive a voltage at a pad.

BRIEF DESCRIPTION OF THE DRAWINGS

Additional objects and features of the invention will be more readily apparent from the following detailed description and appended claims when taken in conjunction with the drawings. Although several embodiments are illustrated and described, like reference numerals identify like parts in each of the figures, in which:

DETAILED DESCRIPTION

Figure 1:
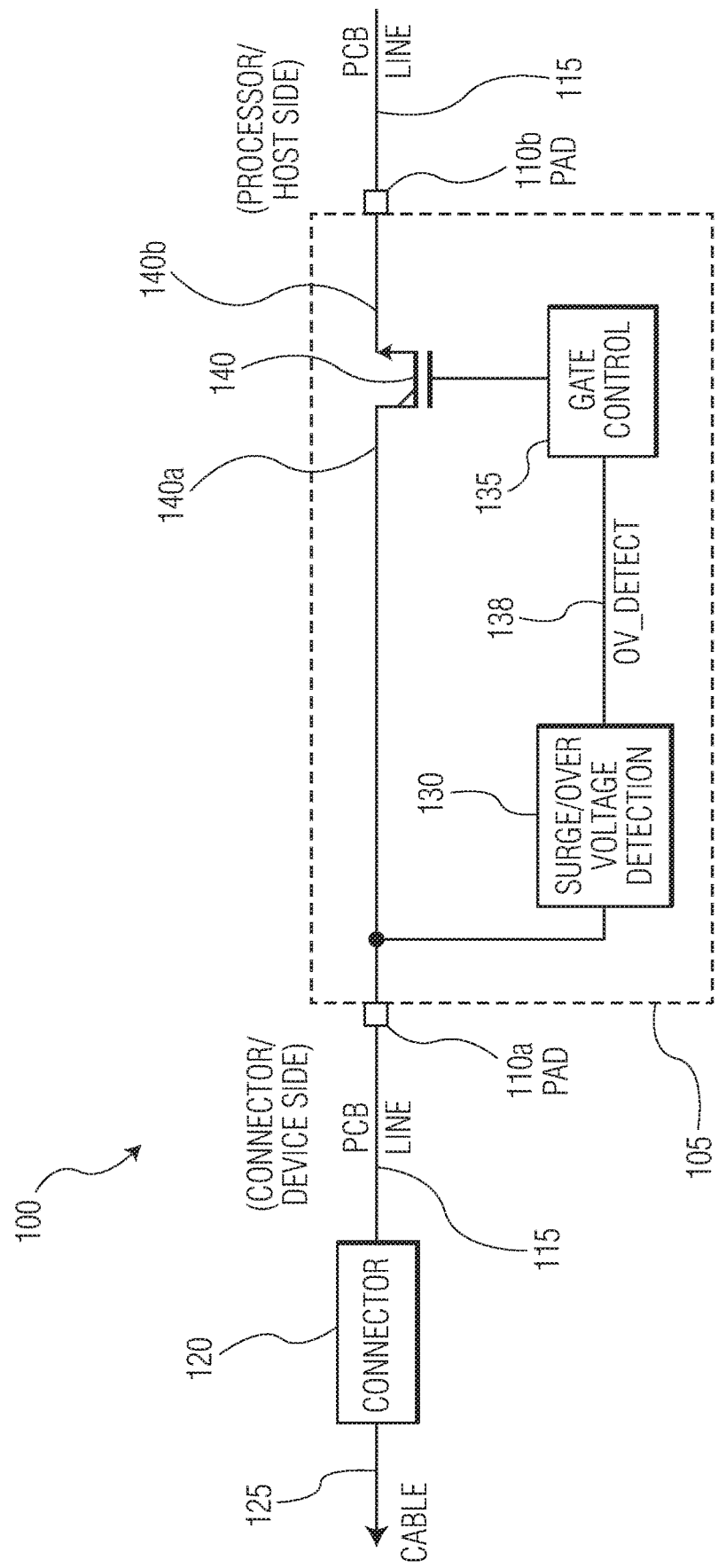
FIG. 1 illustrates a connection scheme of a printed circuit board (PCB) in accordance with embodiments described herein.

It should be understood that the figures are merely schematic and are not drawn to scale. It should also be understood that the same reference numerals are used throughout the figures to indicate the same or similar parts.

The descriptions and drawings illustrate the principles of various example embodiments. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various embodiments described herein are not necessarily mutually exclusive, as some embodiments can be combined with one or more other embodiments to form new embodiments. Descriptors such as "first," "second," "third," etc., are not meant to limit the order of elements discussed, are used to distinguish one element from the next, and are generally interchangeable. Values such as maximum or minimum may be predetermined and set to different values based on the application.

Embodiments described herein include a threshold based circuit that turns on when a surge or overvoltage protection event is introduced. The protection circuit stays off in a normal condition to avoid current consumption.

As described herein, an over-voltage detection circuit may detect a surge voltage above a threshold level appearing on a pad. A fast comparator may be enabled to accept the surge voltage and compare it to a reference voltage. An output of the comparator may be an "over voltage detected" signal that may be used by a controller to shut down switches between host and device side of a printed circuit board that are in an ON mode.

Surge is a concern for any circuit including those connected to an external cable. A surge voltage may occur in a form of a fast ramp up to a voltage that is higher than a maximum voltage a device can tolerate. A surge may also exist when an incorrect connector is connected to an existing socket of the connector. In such a case, a low voltage pin on the connector may be connected to an improper higher voltage. The improper connection and surge voltage can last long enough to short the low voltage pin to the higher voltage, and cause considerable damage if not controlled.

If switches illustrated herein are in an OFF mode, there is no requirement for surge detection, and a protection circuit may be controlled to stay off. When switches are ON, but the pad voltage is below the surge level, the surge threshold is not reached and the DC current of the fast comparator protection circuitry stays at zero, resulting in no current drain in the protection circuit.

FIG. 1 illustrates a connection scheme 100 of a printed circuit board (PCB) 105 in accordance with embodiments described herein. The PCB 105 may be connected through a pad 110a on a connector/device side through a PCB line 115 to a connector 120. The connector 120 may be a USB Type-C connector or the like. The PCB 105 may be connected through a second pad 110b on a processor/host side through the PCB line 115 to a host (not illustrated). The host side may include a processor or other load. The connector 120 may receive an opposing connector attached to a cable 125 or other device.

The PCB 105 may include a surge/over voltage protection circuit 130 (hereinafter, protection circuit) to output an OV_detect output signal 138 when an over-voltage or surge condition occurs. The protection circuit 130 may control one or more gates 135 of one or more switches 140 on the host/processor side to be protected. The one or more switches 140 may be MOSFET transistors having an extended drain 140a. Using an extended drain 140a having a high withstand voltage, the switch 140 may withstand a surge for a short amount of time before the surge is detected and routed elsewhere by the protection circuit 130. Also, if one or more switches 140 are off and the protection circuit 130 is off, the extended drain 140a can tolerate a surge voltage at the pin 110a.

The extended drain transistor switch 140 allows a drain side 140a to be used on a connector side and a source side 140b to be used on a host side. Different extended drain or high voltage transistors that may be used to tolerate different maximum voltages. The triangle notch illustrated near the gate of the indicates that the transistor 140 has the extended drain. The drain region of the drain side 140a may extend further and/or wider, having a larger area than a source region of the source side 140b of the extended drain transistor 140.

The protection circuit 130 may detect surge voltage quickly and shut down switches 140 (if they are ON) to protect a host/processor side of the PCB 105 as well as a 140b source side of switches 140. As stated, the protection circuit 130 does not consume any DC current in an absence of a surge voltage, and its loading effect may be small to avoid degrading high speed switch performance.

The source side 140b cannot tolerate a high voltage for more than a few tens of nanoseconds (ns) (<100 nS for 14 nm-CMOS High Voltage NMOS). This means that an entire detection of surge by the protection circuit 130 and shut down of a switch 140 may happen in less than about 100 nS, often less, otherwise the source side 140b of the switch 140 and the HOST side of system will see a higher voltage that they can handle and be damaged.

Figure 2A:
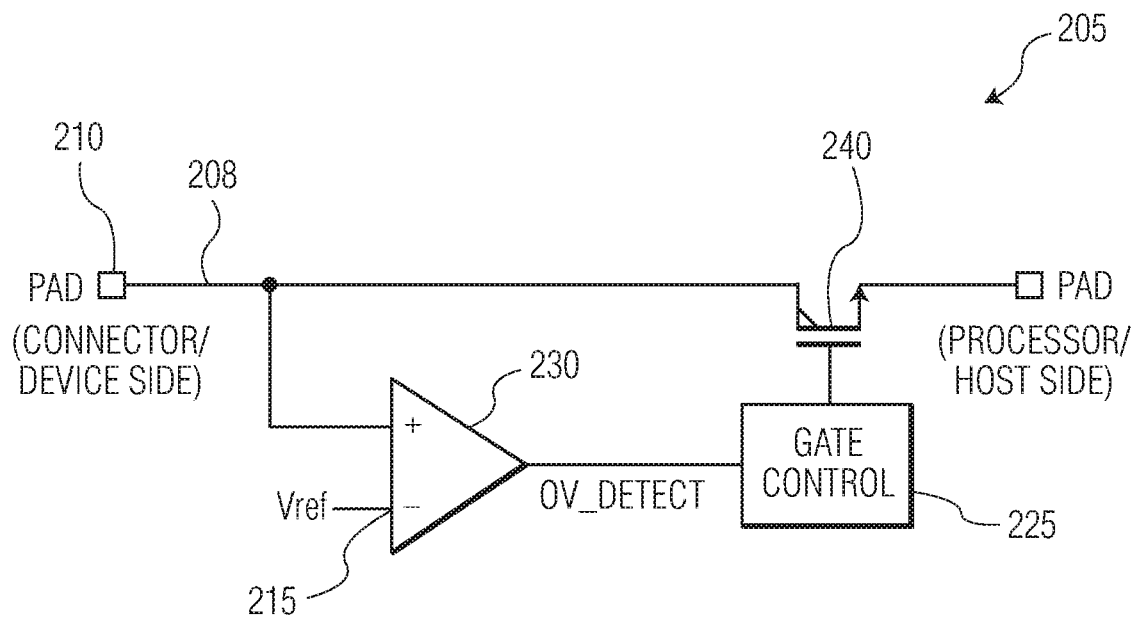
FIGS. 2A and 2B illustrate circuits and for over voltage detection in accordance with embodiments described herein.
Figure 2B:
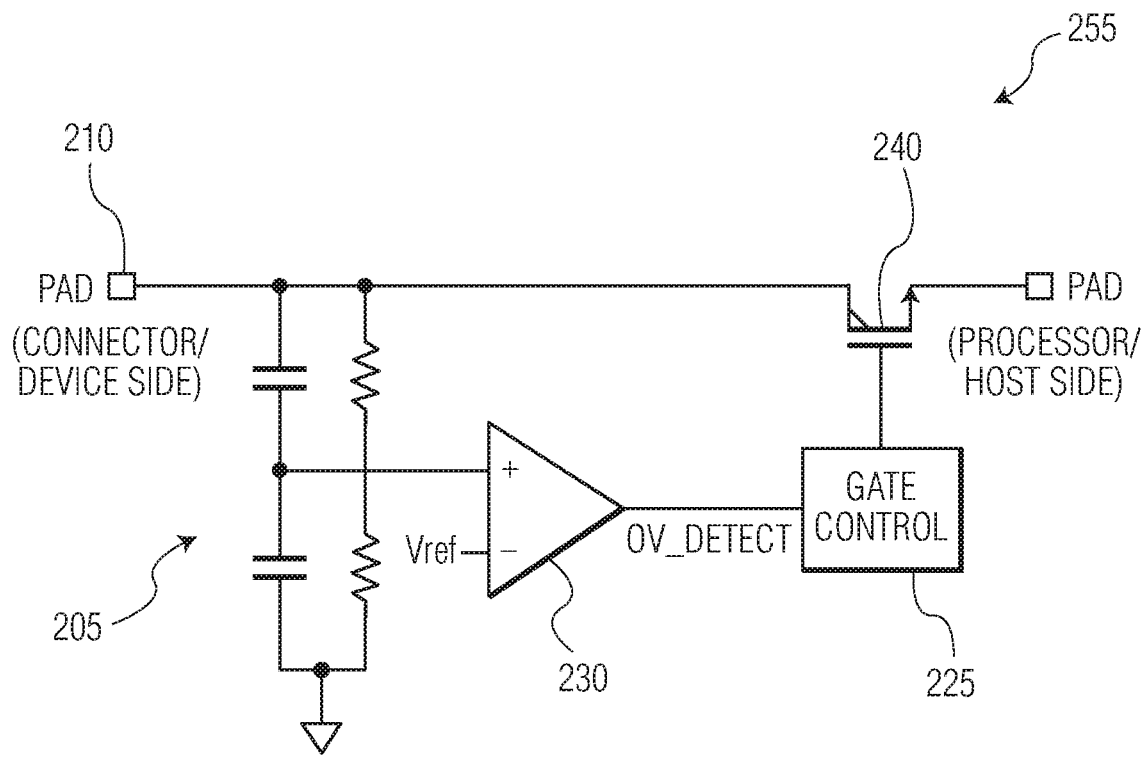

FIGS. 2A and 2B illustrate circuits 205 and 255 for over voltage detection in accordance with embodiments described herein. As illustrated in FIG. 2A, an input 208 of a pad/connector side 210 will be compared to a voltage reference 215 of a comparator 230. A switch 240 will be shut down if an over voltage is detected. In FIG. 2B, a divided ratio of the input voltage of the pad/connector side 210 may be used for fast and delayed detection of a surge voltage. The divided ratio may include a ratio circuit 212 of series connected capacitors and resistors, in parallel. The comparator 230 compares the reference voltage 215 to an output of the divided ratio circuit 212 that inputs the surge voltage. The switch 240 will be shut down if an over voltage is detected.

A fast comparator 230 may be used. In the embodiments of FIG. 2A, the comparator 230 is kept in an ON state, normally consuming a few hundred micro amps of current for a response time of a few tens of ns. The surge or over voltage condition does not happen in a normal condition. Thus, the comparator 220 consumes a constant DC current all the time which is a drain on the circuit. Because more than one pin may face surge protection, more than one surge protection circuit is needed so the DC current consumed will be high which is undesirable for low power applications.

Figure 3:
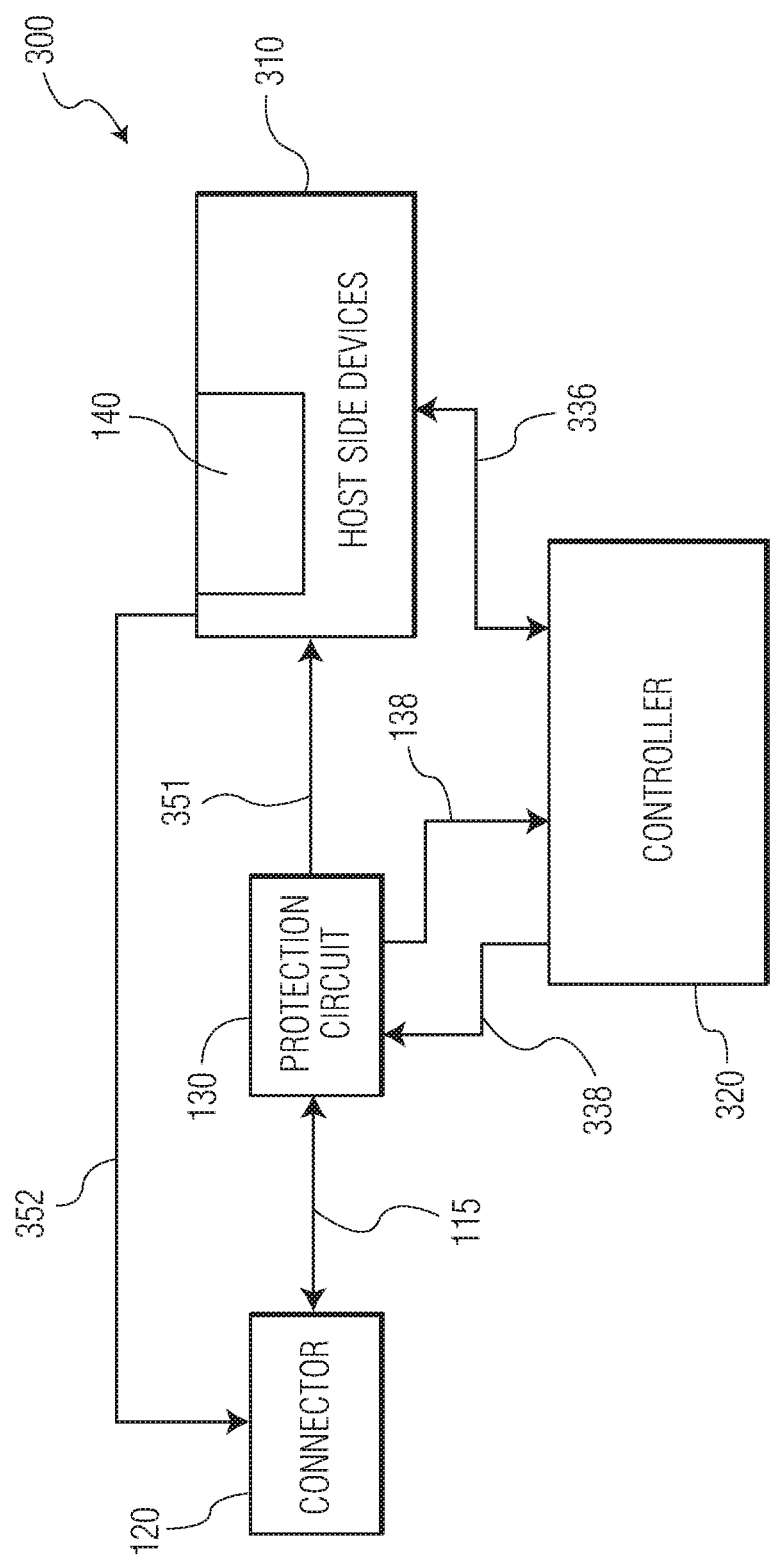
FIG. 3 illustrates a control circuit in accordance with embodiments described herein.

FIG. 3 illustrates a control circuit 300 in accordance with embodiments described herein. The connector 120 may be connected to the protection circuit 130. The protection circuit 130 may be connected to host side devices 310 such as switches 140, devices, and processors in order to send a direct over-voltage signal through connection 351. A controller 320 interfaces between the protection circuit 130 and the host side devices 310. When the host side devices 310 such as one or more switches 140 communicate through the connection 336 that they are ON, the controller 320 enables transistors 413, 415, and 421 (illustrated in FIG. 4) using one or more control signals 338 of the protection circuit 130 in order to detect a surge voltage at pad 110a (illustrated in FIG. 1). Bi-directional communication may take place between the controller 320 and host devices 310. If the host side devices 310 such as one or more switches 140 are in an OFF state, the controller 320 does not enable the transistors 413, 415, and 421 of the protection circuit 130. In both cases, not until a surge event is detected does a comparator 430 (illustrated in FIG. 4) turn on and consume current in the protection circuit 130.

Figure 4:
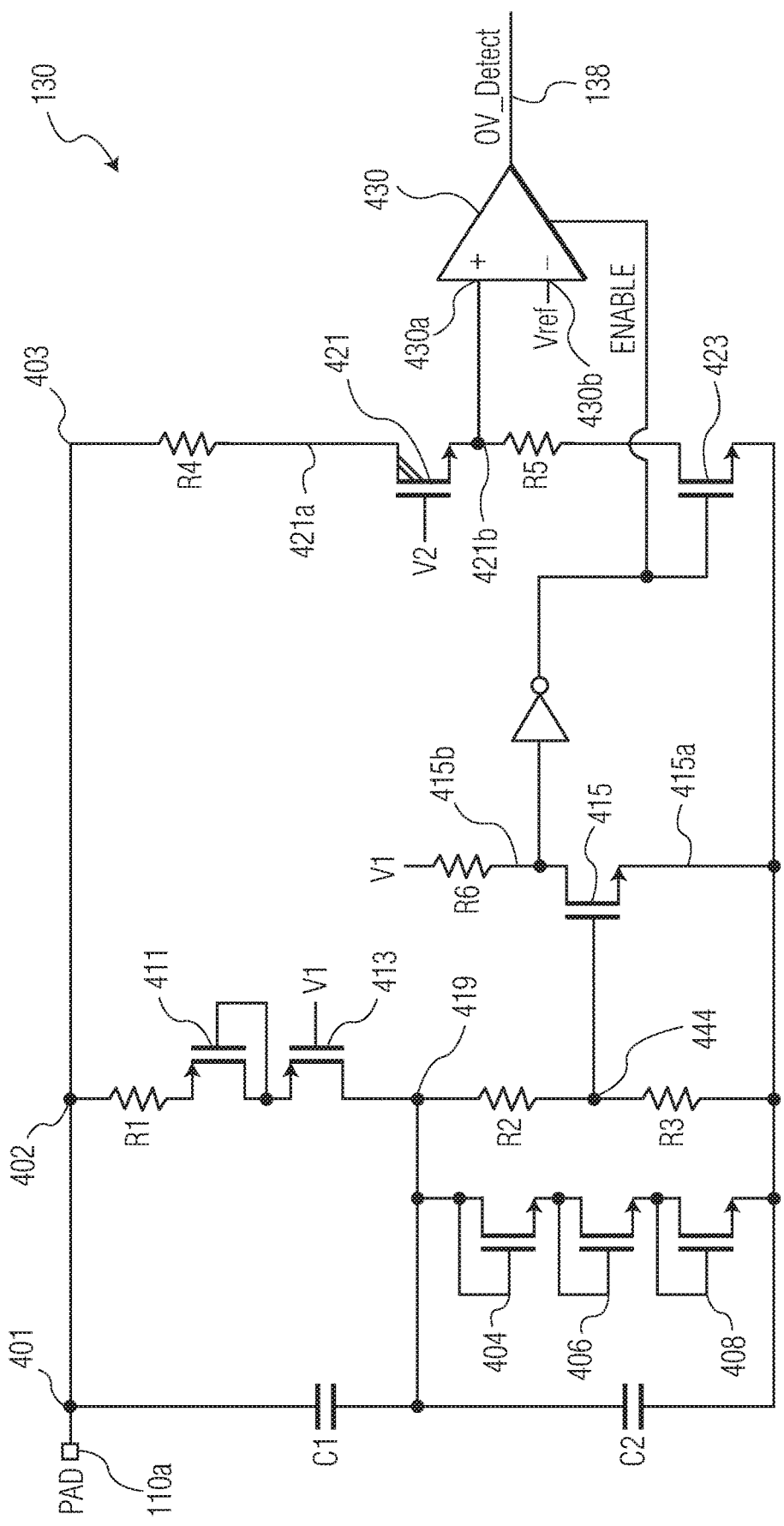
FIG. 4 illustrates a schematic of the protection circuit in accordance with FIGS. 1 and 3.

FIG. 4 illustrates a schematic of the protection circuit 130 in accordance with FIGS. 1 and 3. When switches 140 or host side devices 310 are to be protected, the protection circuit 130 stays off when an input voltage to the pad 110a is below a surge threshold reference level, which causes the DC current of the protection circuit 130 to be zero. The protection circuit 130 quickly turns on when an input voltage is above the surge threshold voltage reference level, then turns on the comparator 430 to ensure that voltage is above the surge voltage threshold level to shut down switches 140 or host side devices to be protected.

Input voltage may enter the protection circuit 130 through the pad 110a. The protection circuit may include three circuit branches 401, 402, and 403, all connected to the pad 110a. A first circuit branch 401 may include a capacitor branch to receive a fast ramp-up voltage at the pad 110a. A second circuit branch 402 may determine a surge threshold voltage of the protection circuit 130, being configured to receive a slow ramp-up voltage at the pad 110a. The second circuit branch 402 may include a first resistor R1, a first diode-connected PMOS transistor 411, a low voltage PMOS transistor 413, second resistor R2 and third resistor R3 also having a same value as resistor R1. When host side switches are ON, if a voltage at the pad 110a exceeds the surge threshold voltage of the combination of elements in the second circuit branch 402, a sufficient voltage will turn on an enabling gate of NMOS transistor 415. Current will flow through the enabling transistor 415 from the source 415a to the drain 415b. The voltage potential at the drain 415b may be inverted and enable the comparator 430, while activating NMOS transistor 423.

A third circuit branch 403 may include a high voltage extended drain transistor 421. When a voltage on the pad 110a is less than a surge voltage, second circuit branch 402 and third circuit branch 403 will not conduct current in a sufficient amount to turn on the comparator 430. The comparator 430 is part of the third circuit branch 403. When the surge voltage is greater than the threshold of the second circuit branch 402 and third circuit branch 403, the surge voltage will appear at a drain 421a of the extended drain transistor 421. Based on different designs of the protection circuit 130, the extended drain 421a may have different lengths, depths, and doping profiles to tailor the extended drain transistor 421 to appropriately scale the protection circuit 130 for a variety of uses. Using the extended drain transistor 421 a surge voltage will not destroy internal circuitry before the comparator 430 is able to output a detection signal. In a case where the protection circuit 130 is not enabled, any high voltage on the pad 110a will not damage the extended drain NMOS 421. The current into the drain 421a may be diminished by resistor R4 such that the voltage at the source 421b does not damage the source 421b. A fast comparator 430 having a high current may be used such that the high voltage at the source 421b is present less than a few tens of nanoseconds, before being drawn through the comparator 430. In a surge event, a voltage at the non-inverting input 430a will be greater than a reference voltage 430b, and the comparator 430 will output an overvoltage detection output signal 138 to the controller 320. The controller 320 may then route the surge voltage to ground or away from the host side devices 310 and switch off switches 140 or other switches within host side devices 310 to prevent damage thereto.

When switches 140 on a host side, or switches to be protected are off, the transistors 413, 415, and 421 are not enabled, and the protection circuit is switched off.

A voltage drop across resistors R2 and R3 may be set by three diode-connected NMOS transistors 404, 406, and 408. The threshold voltage level set by and detected by the second circuit branch 402 may be supplemented by a fast detection circuit using capacitors C1 and C2. A capacitor C1 may have a higher capacitance than capacitor C2. If a surge voltage is input to the pad 110a having a very quick spike, the capacitor C1 may store an initial charge before dissipating the charge across resistors R2 and R3. If an initial spike is followed by a slower surge, the series capacitors C1 and C2 may work in combination with R1, diode connected transistor 411 and low voltage transistor 413 to combine a voltage level at node 419, before triggering enabling transistor 415 to turn on.

Thus, if a voltage at the pad 110a rises slowly, the diode/resistive second circuit branch 402 will handle the job. In case of a fast ramp-up (surge), the two series capacitors C1 and C2 will act faster. The transistor 415 will be enabled with the transistors 421 and 423 and comparator 430 being enabled thereafter.

An example of the operation of the the protection circuit 130 using numerical values may be as follows. A reference voltage for the comparator 430 may equal a band gap voltage which may equal 1.25V. R1, R2, and R3 may equal 1M ohm. Resistor R2 may be 4K ohm and resistor R3 may be 1.7 k ohm.

A voltage drop across transistors 413, 415, and 421 may be about 0.7V. The voltage drop across diode-connected transistors 404, 406, and 408, and 413 may likewise be 0.7V. At the beginning of detection of an overvoltage, the three diode-connected transistors 404, 406, and 408 are ON, so voltage at node 419 may be three times 0.7V which is 2.1V. The current passing through resistors R2 and R3 may be equal to the current 2.1V divided by 2M ohm, which is about 1 uA. These calculations bring a voltage at the pad 110a to be a sum of a gate voltage of 1.8V of the transistor 413, plus the 0.7V voltage drop of the transistor 413, plus 0.7V of the diode-connected transistor 411, plus the current through resistors R2 and R3 multiplied by the 1M ohm resistor R1, which equals substantially 4.2V as a surge threshold voltage.

In this scenario, voltage at node 444 equals the 2.1V of the series diode connected transistors 404, 406, and 408 divided by two to equal just about 1V. Resistors R2 and R3 act as a voltage divider. The 1V at node 444 may turn on the enabling transistor 415. This turn-on will enable the comparator 430 and also, the NMOS transistor 423 will turn on.

In the third circuit branch 403, current passing through the resistor R5 may be 3.6V at the gate of the enhanced drain transistor 421 minus a voltage drop of 0.7 across the transistor 423 divided by resistor R5. A minimum voltage at comparator input 430a will be 1.25V+ε. Thus a current passing through resistor R5 is 1.25/R5, being 7.35 mA. The PAD voltage 110a is 1.25V plus the 7.35 mA multiplied by R4 which equals 7.35 mA*4 Kohm+1.25V which equals about 4.2V which is in line with calculation for the edge of a detection point as described above. All voltages above 4.2V will be detected by the comparator 430 as over-voltage. A full swing signal of USB is below 3V, so a threshold of 4.2V may be reasonable.

Figure 5:
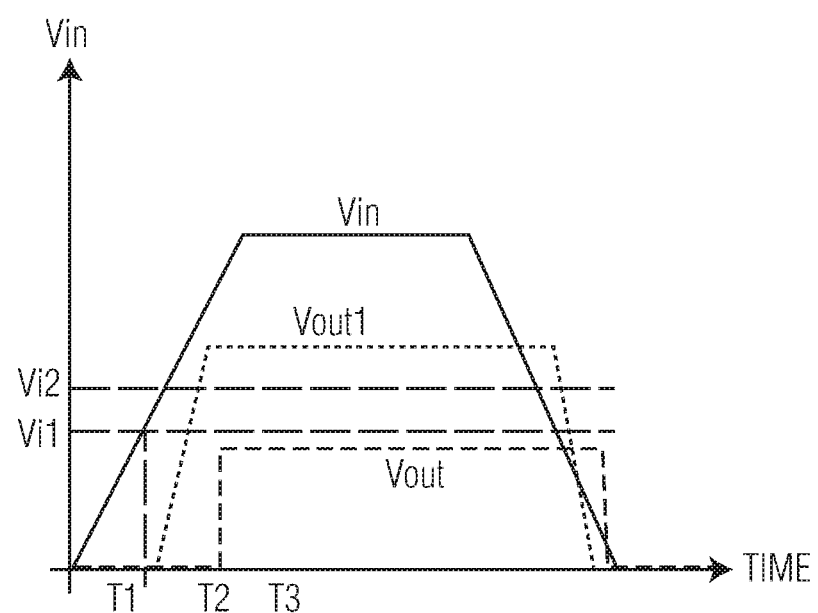
FIG. 5 illustrates input and output voltages of the surge protection circuit in accordance with FIG. 4.

FIG. 5 illustrates input and output voltages of the surge protection circuit in accordance with FIG. 4. Vi1 is a minimum threshold voltage (e.g., 4.2V) in which the protection circuit 130 will turn on. Vi2 is Vi1 plus delta, in which delta accounts for PVT variations in the PCB 105. Because of non-idealities in the protection circuit 130, the threshold value may lie between Vi1 and Vi2 (e.g., 5V). When the input voltage to the pad 110a is above the threshold voltage Vi1 at time T1, the protection circuit 130 will turn on and enable the comparator 430. The comparator 430 output detection signal (Vout) will be on until T2. The difference T2 minus T1 is the time response of the protection circuit 130 that may be a short duration. T3 is the time when the protection circuit 130 will be switched off. Thus the time T3 minus T1 may be less than 100 nS. Vout1 is the positive input 421a of the comparator 430.

Embodiments described herein may be used for any kind of over voltage and/or surge detection in a high speed or low speed circuit like high speed or load switches. Detection level and speed may be adjusted by changing top R1 and R2 resistor values and, making the comparator 430 faster or slower, depending on the application. Comparator 430 speed may be determined by a current draw thereof, while in operation. The comparator 430 uses no current when the protection circuit 130 does not detect an over-voltage or surge voltage. The output signal 138 of the comparator 430 which indicates the presence of a surge or over voltage may be output to the controller 320 which may be used to shut down the switches 140 or host side devices 310 or as an indication of surge/over voltage input. The static current in normal operation of the comparator 430 in absence of surge or over voltage is zero. The consumed current of the comparator 430 during a surge event may be a function of pad voltage, and may be adjusted using values of R1, R2, R3, R4 and R5.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

The invention claimed is:

1. A protection circuit, comprising:
a pad configured to input an external voltage from a connector;
a first circuit branch connected to the pad and configured to receive a fast ramp-up surge at the pad;
a second circuit branch connected to the pad and configured to receive a ramp-up surge at the pad;
a third circuit branch connected to the pad and configured to output a surge detection signal when a surge voltage is received at the pad;
an enabling transistor connected between the second circuit branch and the third circuit branch;
at least one switch to be protected; and
a controller configured to control components of the second circuit branch and third circuit branch of the protection circuit based on an on-state of the at least one switch to be protected.

2. The protection circuit of claim 1,
wherein the third branch includes a comparator to output the surge detection signal when the surge voltage is received at the pad.

3. The protection circuit of claim 2,
wherein the enabling transistor enables the comparator when the surge voltage is received at the pad.

4. The protection circuit of claim 2,
wherein the protection circuit stays off in a first state to avoid current consumption of the comparator.

5. The protection circuit of claim 1,
wherein the first branch includes a pair of series connected capacitors.

6. The protection circuit of claim 1,
wherein the third branch includes an extended drain transistor to protect internal circuitry of the protection circuit during a surge event.

7. The protection circuit of claim 1, comprising
a plurality of series connected transistors to contribute to a threshold voltage of the first branch.

8. The protection circuit of claim 7,
wherein the series-connected transistors are diode-connected transistors.

9. The protection circuit of claim 1,
wherein the comparator outputs an over-voltage signal to the controller to shut down the at least one switch when the at least one switch is in an on-mode.

10. The protection circuit of claim 1,
wherein the controller receives the surge detection signal and switches off the at least one switch to protect the at least one switch from a surge received at the pad.

11. The protection circuit of claim 1,
wherein if the switch to be protected is off, the controller does not supply power to transistors of the second branch and the third branch.

12. The protection circuit of claim 1,
when the switch to be protected is on and the pad voltage is below the surge level, a DC current of detection circuit stays zero.

13. A protection circuit, comprising:
an input configured to receive an external voltage;
an output configured to be coupled to a circuit to be protected;
a switch coupled between the input and the output;
a fast surge detection circuit configured to receive and compare the external voltage to a fast surge voltage reference level;
a slow surge detection circuit configured to receive and compare the external voltage to a slow surge voltage reference level;
a comparator coupled to the input, coupled to the switch, and configured to receive the external voltage;
wherein the comparator is responsive to an enable signal;
an enabling transistor coupled to both the fast surge detection circuit and the slow surge detection circuit;
wherein the enabling transistor is configured to send the enable signal to the comparator when the external voltage is above either the fast surge voltage reference level or the slow surge voltage reference level;
wherein the comparator is configured to compare the external voltage to a surge voltage threshold level in response to the enable signal; and
wherein the comparator is configured to turn off the switch if the external voltage is above the surge voltage threshold level.

14. The protection circuit of claim 13:
wherein the comparator is configured to be powered off in an absence of the enable signal.

15. The protection circuit of claim 13:
wherein the fast surge detection circuit includes a set of series connected capacitors.

16. The protection circuit of claim 13:
wherein the slow surge detection circuit includes a resistor and a set of series connected transistors or diodes.

17. The protection circuit of claim 13, further comprising:
an extended drain transistor coupled between the input and the comparator;
wherein the extended drain transistor is configured to protect the comparator from a surge in the external voltage.

18. The protection circuit of claim 13, further comprising a plurality of series connected transistors or diodes configured to set the fast and slow voltage reference levels.

* * * * *